United States Patent
Lawton

(10) Patent No.: US 6,811,937 B2
(45) Date of Patent: Nov. 2, 2004

(54) RADIATION-CURABLE RESIN COMPOSITION AND RAPID PROTOTYPING PROCESS USING THE SAME

(75) Inventor: John A. Lawton, Landenberg, PA (US)

(73) Assignee: DSM Desotech, Inc., Elgin, IL (US)

( * ) Notice: Subject to any disclaimer, the term of this patent is extended or adjusted under 35 U.S.C. 154(b) by 89 days.

(21) Appl. No.: 10/091,119

(22) Filed: Mar. 6, 2002

(65) Prior Publication Data

US 2003/0104313 A1 Jun. 5, 2003

Related U.S. Application Data

(60) Provisional application No. 60/299,470, filed on Jun. 21, 2001.

(51) Int. Cl.$^7$ .............................................. G03F 7/075
(52) U.S. Cl. ...................... 430/15; 430/269; 430/280.1; 430/285.1; 522/2; 522/103; 264/401
(58) Field of Search .............................. 430/280.1, 269, 430/15, 285.1; 264/401; 522/2, 103

(56) References Cited

U.S. PATENT DOCUMENTS

| | | | |
|---|---|---|---|
| 3,989,610 A | 11/1976 | Tsukada et al. | |
| 4,237,216 A | 12/1980 | Skarvinko | 430/280.1 |
| 4,426,431 A | 1/1984 | Harasta et al. | 430/14 |
| 4,623,676 A | * 11/1986 | Kistner | 522/15 |
| 5,476,748 A | 12/1995 | Steinmann et al. | 430/280.1 |
| 5,476,749 A | 12/1995 | Steinmann et al. | |
| 5,510,226 A | 4/1996 | Lapin et al. | |
| 5,705,316 A | 1/1998 | Steinmann et al. | |
| 5,707,780 A | 1/1998 | Lawton et al. | |
| 5,849,459 A | 12/1998 | Hagiwara et al. | |
| 5,972,563 A | 10/1999 | Steinmann et al. | |
| 6,054,250 A | 4/2000 | Sitzmann et al. | |
| 6,100,007 A | 8/2000 | Pang et al. | |
| 6,127,092 A | 10/2000 | Schon et al. | |
| 6,287,745 B1 | 9/2001 | Yamamura et al. | |
| 6,287,748 B1 | 9/2001 | Lawton | |
| 2001/0046642 A1 | 11/2001 | Johnson et al. | |

FOREIGN PATENT DOCUMENTS

| | | |
|---|---|---|
| CA | 2171504 | 9/1996 |
| EP | 938 026 | 8/1999 |
| WO | 97 42549 | 9/1997 |

OTHER PUBLICATIONS

"Antimonate", Webster's 1913 Dictionary as cited by www.hyperdictionary.com, one page..*

* cited by examiner

*Primary Examiner*—Cynthia Hamilton
(74) *Attorney, Agent, or Firm*—Mayer, Brown, Rowe & Maw LLP

(57) ABSTRACT

The present invention provides compositions comprising a cationically curable component and a substantially compatible free radical polymerizable component. Compatible free radical polymerizable components include alkoxylated free radical polymerizable components. Objects obtained by curing the present compositions, for instance by rapid prototyping the compositions, have an improved clarity.

15 Claims, No Drawings

RADIATION-CURABLE RESIN COMPOSITION AND RAPID PROTOTYPING PROCESS USING THE SAME

This application claims the benefit of U.S. Provisional Application No. 60/299,470, filed Jun. 21, 2001.

FIELD OF THE INVENTION

The present invention relates to radiation-curable compositions comprising a cationically curable compound and a free radical polymerizable compound. The compositions, after cure, have improved clarity. One aspect of the invention concerns forming three-dimensional objects by rapid prototyping the present compositions.

BACKGROUND

Cationically polymerizable compositions, such as epoxy based polymerizable compositions, are capable of producing articles having high image accuracy. However, due to the relatively slow cure of the cationically curable compositions it is often necessary to prepare hybrid compositions, i.e. mix the cationically curable compounds with relatively fast curing free radical polymerizable compounds. Examples of such hybrid compositions are set forth in, for instance, U.S. Pat. Nos. 5,972,563; 5,468,748; 5,468,749; 5,707,780; and Canadian Patent 2,171,504. Although the addition of free radical polymerizable components helps improve the image accuracy, it typically results in cured products having low or no transparency and a frequently whitish appearance. These disadvantages can be particularly pronounced in products comprising fairly thick layers (or a multitude of consecutive thin layers) of the cured composition, making these hybrid compositions unpreferred or even unsuitable for a wide variety of applications.

It is an object of the present invention to provide radiation-curable hybrid compositions that result, upon cure, in products having an improved clarity. In particular, an object of the invention is to provide a composition for forming, via rapid prototyping, 3-dimensional objects having improved clarity.

SUMMARY OF THE INVENTION

In one embodiment, the present invention provides a composition comprising:
  (i) a cationically polymerizable component, preferably an epoxy component, more preferably a cyclohexeneoxide component;
  (ii) a first free radical polymerizable component selected from the group consisting of:
    (a) non-aromatic free radical polymerizable components comprising a $C_1$–$C_{10}$ ether group, preferably at least two $C_2$–$C_4$ ether groups; and
    (b) aromatic free radical polymerizable components comprising more than four $C_1$–$C_{10}$ ether groups, preferably at least 8 $C_2$–$C_4$ ether groups, and
  (iii) a second free radical polymerizable component, preferably a free radical polymerizable component comprising at least three (meth)acrylate groups;
  wherein the composition has a clarity ratio greater than 1.03.

Another embodiment of the present invention provides a composition comprising
  (i) a cationically polymerizable component, and
  (ii) a free radical polymerizable component other than caprolactone acrylate, wherein the composition, after cure, has a clarity of at least 90%.

The present invention also provides processes, e.g. a rapid prototyping process, for curing the present compositions. In addition, the present invention provides objects, e.g. three dimensional objects, obtained by such processes.

In yet a further embodiment, the present invention provides a process for improving, by more than a factor 1.03, the clarity of a product obtained by curing a hybrid composition. The process comprises:
  (i) adding, prior to curing, a compatible free radical polymerizable component to the hybrid composition.
Suitable compatible free radical polymerizable components for this process include, for instance, components selected from the group consisting of:
  (a) non-aromatic free radical polymerizable components comprising a $C_1$–$C_{10}$ ether group, preferably at least two $C_2$–$C_4$ ether groups; and
  (b) aromatic free radical polymerizable components comprising more than four $C_1$–$C_{10}$ ether groups, preferably more than four $C_2$–$C_4$ ether groups; and
  (c) hydroxyfunctional free radical polymerizable ester components.

DETAILED DESCRIPTION OF THE INVENTION

While not wishing to be limited by any particular theory, it is believed that the comparatively low clarity of products prepared with conventional hybrid compositions is caused by the use of free radical polymerizable components that, upon cure, do not mix or homogenize well with the cationically polymerizable compounds. It is believed that in conventional compositions, the cationically polymerizable compounds and the free radical polymerizable compounds cure (at least partly) in separate "cationically curable component clusters" and "free radical curable component clusters". This clustering is believed to be responsible for light scattering by the cured product, which consequently results in the comparatively poor transparency and/or whitish appearance. Accordingly, the present invention relates to compositions that comprise a cationically polymerizable component and a free radical polymerizable component, whereby the free radical polymerizable component comprises one or more groups that are substantially compatible with the cationically polymerizable component upon cure.

(A) Cationically Polymerizable Component

The present invention comprises a suitable cationically polymerizable component, such as, for instance, an epoxide-containing compound.

Epoxide-containing materials, also referred to as epoxy materials, are cationically curable, by which is meant that polymerization and/or crosslinking and other reactions of the epoxy group can be initiated by cations. These materials may be monomers, oligomers or polymers and are sometimes referred to as "resins." Such materials may have an aliphatic, aromatic, cycloaliphatic, arylaliphatic or heterocyclic structure; they can comprise epoxide groups as side groups or groups that form part of an alicyclic or heterocyclic ring system. Epoxy resins of those types include those that are generally known and are commercially available.

The composition may contain one or more epoxy resins. Preferably, the composition will comprise at least one liquid (at room temperature, 23° C.) component such that the combination of materials is a liquid. Thus, the epoxide-containing material is preferably a single liquid epoxy material, a combination of liquid epoxy materials, or a combination of liquid epoxy material(s) and solid epoxy material(s) which is soluble in the liquid. However, in certain embodiments, e.g. in embodiments where the epoxide material is soluble in other components of the composition, the epoxide material may be comprised only of materials that are solid at room temperature. When solid compositions are used, the compositions may be thinned or liquefied by applying shear and/or heat prior to or during use.

Examples of suitable epoxy materials include polyglycidyl and poly(methylglycidyl) esters of polycarboxylic acids, or poly(oxiranyl) ethers of polyethers. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. The polyether can be poly(tetramethylene oxide).

Suitable epoxy materials also include polyglycidyl or poly(-methylglycidyl) ethers obtainable by the reaction of a compound having at least one free alcoholic hydroxy group and/or phenolic hydroxy group and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane.

Other suitable epoxy compounds include those which may be derived from mono nuclear phenols, such as, for example, resorcinol or hydroquinone, or they may be based on polynuclear phenols, such as, for example, bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs.

Suitable epoxy materials also include poly(N-glycidyl) compounds, which are, for example, obtainable by dehydrochlorination of the reaction products of epichlorohydrin with amines that comprise at least two amine hydrogen atoms, such as, for example, n-butylamine, aniline, toluidine, m-xylylene diamine, bis(4-aminophenyl)methane or bis(4-methylaminophenyl)methane. Suitable poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Examples of suitable epoxy materials include poly(S-glycidyl) compounds which are di-S-glycidyl derivatives which are derived from dithiols, such as, for example, ethane-1,2-dithiol or bis(4-mercaptomethylphenyl) ether.

Preferably epoxide-containing materials are selected from the group consisting of bis(2,3-epoxycyclopentyl)ether, 2,3-epoxy cyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexane, 3,4-epoxy-6-methylcyclohexylmethyl-3,4-epoxy-6-methylcyclohexanecaboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, vinylcyclohexene dioxide, dicyclopentadiene diepoxide, α-(oxiranylmethyl)-ω-(oxiranylmethoxy) poly(oxy-1,4-butanediyl), diglycidyl ether of neopentyl glycol, or 2-(3,4-epoxycyclohexyl-5,5-spiro-3,4-epoxy)cyclohexane-1,3-dioxane, and combinations thereof.

It is, however, also possible to use epoxy resins in which the 1,2-epoxy groups are bonded to different heteroatoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1,3-bis(5,5-dimethyl-1-glycidylhydantoin-3-yl)propane. In addition, liquid prereacted adducts of such epoxy resins with hardeners are suitable for epoxy resins.

Preferred epoxy materials include cycloaliphatic diepoxides. Especially preferred are bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methylcyclohexane-carboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl) ether, 2-(3,4-epoxycyclohexyl-5,5-spiro-3,4-epoxy)cyclohexane-1,3-dioxane, and combinations thereof.

It is preferred that the epoxy compounds comprise at least one cyclohexeneoxide structure, more preferably at least 2 cyclohexeneoxide structures.

The epoxy materials can have molecular weights which vary over a wide range. In general, the epoxy equivalent weight, i.e., the number average molecular weight divided by the number of reactive epoxy groups, is preferably in the range of 60 to 1000.

Other cationically polymerizable components that may be used in the composition of the present invention include, for instance, cyclic ether compounds, cyclic lactone compounds, cyclic acetal compounds, cyclic thioether compounds, spiro orthoester compounds, and oxetane compounds. Preferred oxetane compounds include hydroxyfunctional oxetane compounds, such as, for instance, compounds represented by the following formula (1):

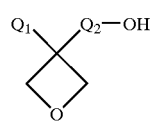

(1)

wherein
$Q_1$ represents a hydrogen atom, an alkyl group having 1 to 6 carbon atoms (such as a methyl, ethyl, propyl, or butyl group), a fluoroalkyl group having 1 to 6 carbon atoms, an allyl group, an aryl group, a furyl group, or a thienyl group; and $Q_2$ represents an alkylene group having 1 to 6 carbon atoms (such as a methylene, ethylene, propylene, or butylene group), or an alkylene group containing an ether linkage, for example, an oxyalkylene group, such as an oxyethylene, oxypropylene, or oxybutylene group. In formula (1), $Q_1$ preferably represents a lower alkyl group, more preferably an ethyl group, and $Q_2$ preferably represents a methylene group.

It is of course possible to use mixtures of cationically polymerizable components in the compositions according to the invention.

Preferably the composition of the present invention comprises, relative to the total weight of the composition, at least 10 wt %, more preferably at least 20 wt %, and most preferably at least 30 wt % of cationically curable components. Preferably the composition of the invention comprises, relative to the total weight of the composition, less than 90 wt %, more preferably less than 80 wt %, and most preferably less than 70 wt % of cationically curable components.

B. Compatible Free Radical Polymerizable Compound

The present compositions comprise one or more free radical polymerizable components that are substantially compatible with the cationically polymerizable component. It has been found that free radical polymerizable components comprising a certain quantity of ether groups are substantially compatible with a variety of cationically polymerizable compounds. An ether group according to the present invention is a group represented by

—(R—O)—            (2)

wherein
- R represents a branched or unbranched, cyclic or non-cyclic aliphatic group comprising from 1–10 carbon atoms, preferably 2–6 carbon atoms, more preferably 2–4 carbon atoms, and most preferably 2–3 carbon atoms. Preferably, R consists of carbon atoms and hydrogen atoms, but in certain embodiments some or all of these hydrogen atoms may be replaced with other atoms, preferably monovalent atoms, such as for instance halogen atoms. Preferably, R is non-cyclic. The oxygen in formula (2) is bonded to a group other than hydrogen ("H") or carbonyl ("C=O"). Preferably the oxygen in formula (2) is bonded, besides to "R", to a cyclic or non-cyclic aliphatic hydrocarbon group or an aromatic ring.

Preferably the compatible free radical polymerizable component (hereinafter also referred to as "compatible component") comprises at least one $C_1$–$C_{10}$ ether group, more preferably at least one $C_2$–$C_8$ ether group, and most preferably at least one $C_2$–$C_4$ ether group. The compatible component may be monofunctional (i.e. comprise one free radical polymerizable group per molecule) or polyfunctional (i.e. comprise more than one free radical polymerizable group per molecule). Preferably, the compatible component comprises at least two free radical polymerizable groups, and more preferably the compatible component is difunctional. Preferably the compatible component comprises (meth)acrylate groups as radiation-curable groups. Acrylate groups are particularly preferred. The term "(meth)acrylate" is understood herein to include an acrylate and/or methacrylate.

(b1): Non-aromatic Components Comprising at Least Two Ether Groups.

Free radical polymerizable components that are absent an aromatic ring-structure and that comprise at least one, preferably at least two, ether groups are suitable as compatible free radical polymerizable component in the present compositions. Preferably the non-aromatic compatible component comprises at least one ether group per free radical polymerizable group.

Monofunctional components that may be used as the non-aromatic compatible component include, for instance alkoxylated isodecyl acrylate, alkoxylated isobornyl acrylate, and alkoxylated lauryl acrylate. It is preferred, however, to use polyfunctional components. Examples of suitable non-aromatic compatible polyfunctional components include, for instance, tripropyleneglycol diacrylate, polypropyleneglycol dimethacrylate, alkoxylated neopentylglycol diacrylate, alkoxylated alkanediol diacrylates (e.g. ethoxylated or propoxylated hexanediol diacrylate), and alkoxylated trimethylolpropane triacrylate. Also oligomeric components may be used, such as, for instance, polytetrahydrofuran poly(meth)acrylates, poly(oxyethylene-oxypropylene) random or block copolymer poly(meth)acrylates, and poly(oxyethylene-oxybutylene) random or block copolymer poly(meth)acrylates. The number average molecular weight $M_n$ of the oligomeric components is preferably between 250–5000 g/mol, more preferably between 250–2000 g/mol, and most preferably between 250–1250 g/mol.

In one embodiment, the non-aromatic free radical polymerizable components are not only absent aromatic ring structures but are also absent aliphatic ring structures.

Non-aromatic free radical polymerizable components include those represented by the following formula (3):

X—[(O—R)$_m$—A]$_n$            (3)

wherein
- X represents a branched or unbranched aliphatic group comprising 1–10 carbon atoms, preferably 1–6 carbon atoms, more preferably 3–5 carbon atoms;
- n represent an integer from 1 to 6, preferably 2–4, more preferably 2–3;
- each R independently represents a branched or unbranched, cyclic or non-cyclic aliphatic group comprising from 1–10 carbon atoms, preferably 2–6 carbon atoms, more preferably 2–4 carbon atoms, and most preferably 2–3 carbon atoms. Preferably, R consists of carbon atoms and hydrogen atoms, but in certain embodiments some or all of these hydrogen atoms may be replaced with other atoms, preferably monovalent atoms, such as for instance halogen atoms. Preferably, R is non-cyclic;
- each m independently represents an integer from 0–10, preferably 1–5, more preferably 1–3; at least one m represents an integer of at least 1, preferably at least 2;
- each A independently represents a free radical polymerizable group, preferably a (meth)acrylate group, more preferably an acrylate group.

For instance, if n represents 2, then formula (3) comprises components represented by the following formula (4):

A—(R—O)$_{\overline{m}}$—X—(O—R)$_{\overline{m}}$—A            (4)

wherein each A may be the same or different, each m may be the same or different, and each R may be the same or different.

A specific example of a component where n represents 2 is, for instance, propoxylated (1+1) neopentylglycol diacrylate:

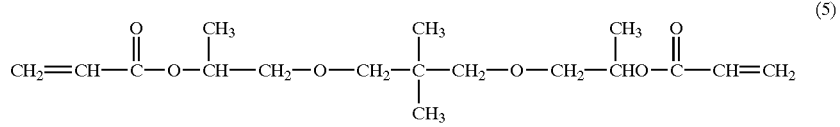
(5)

(b2): Aromatic Components Comprising more than Four Ether Groups.

If aromatic components are used as the compatible component, then it is preferred that the compatible component comprises more than four ether groups. It is further preferred that the aromatic component comprises more than two ether groups per free radical curable group, more preferably at least 4 ether groups per free radical curable group.

Monofunctional aromatic compatible components that may be used include, for instance, alkoxylated alkyl phenol acrylates (e.g. ethoxylated or propoxylated nonylphenol acrylate). It is preferred, however to use aromatic compatible components that are polyfunctional. Particularly preferred are components represented by the following formula (6):

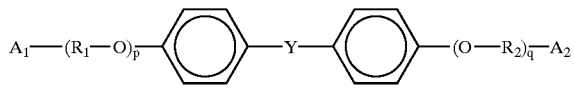

(6)

wherein
- $A_1$ and $A_2$ independently represent a free radical polymerizable group, preferably a (meth)acrylate group, more preferably an acrylate group;
- $R_1$ and $R_2$ independently represents a group according to R (as defined above);
- p represents an integer from 0 to 30, preferably 2 to 15, more preferably 4 to 15.
- q represents an integer from 0 to 30, preferably 2 to 15, more preferably 4 to 15.
- p+q is at least 5, preferably at least 8, more preferably at least 12; and
- Y represents a branched or unbranched aliphatic group comprising 1–10 carbon atoms, preferably 1–6 carbon atoms, more preferably 3–5 carbon atoms, most preferably 3 carbon atoms.

An example of a compound represented by formula (6) is, for instance, ethoxylated (4+4) bisphenol A diacrylate:

The present compositions preferably comprise, relative to the total weight of the composition, 30 more than 2 wt %, even more preferably at least 3 wt %, and most preferably at least 5 wt % of compatible free radical polymerizable component. The present compositions preferably comprise, relative to the total weight of the composition, at most 60 wt %, more preferably at most 30 wt %, even more preferably at most 15 wt %, and most preferably at most 10 wt % of compatible free radical polymerizable component.

In a variety of applications, other properties of the cured composition than just clarity are often taken into consideration, such as, for instance, strength and elongation. Accordingly, a person of ordinary skill in the art may choose to include only 5 wt % of, e.g., propoxylated neopentylglycol acrylate (1 PO/Acr) in a hybrid composition in order to achieve an optimum balance between clarity and other relevant properties, whereas in consideration of clarity only it might have been preferred to add a higher amount.

C. Additional Free Radical Polymerizable Component

The present compositions comprise, as noted above, at least one suitable compatible free radical polymerizable component. However, the composition may comprise additional free radical polymerizable components. While not wishing to be bound by any particular theory, it is believed that the compatible free radical polymerizable component can act as a surfactant to compatibilize, upon cure, the cationically polymerizable component with additional free radical polymerizable components.

The compositions may comprise any suitable additional free-radical polymerizable compound. For instance, the compositions may further comprise (meth)acrylate functional components other than the compatible components mentioned in the above section B.

Suitable as the acrylic component are, for example, diacrylates of cycloaliphatic or aromatic diols, such as 1,4-dihydroxymethylcyclohexane, 2,2-bis(4-hydroxycyclohexyl)propane, 1,4-cyclohexanedimethanol, bis(4-hydroxycyclohexyl)methane, hydroquinone, 4,4-dihydroxybiphenyl, bisphenol A, bisphenol F, bisphenol S, and combinations thereof. These acrylates include those that are known and may be commercially available.

It is preferred to include a free radical polymerizable component having a functionality greater than 2 as the

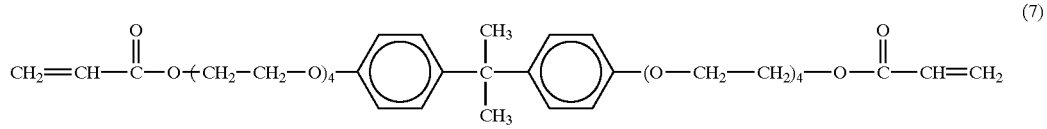

(7)

b(3) Hydroxyfunctional Free Radical Polymerizable Ester Components

Although generally less preferred for clarifying compositions, hydroxyfunctional free radical polymerizable ester components have also been found to be useful in certain embodiments. An example is, for instance, caprolactone acrylate. In one embodiment, the present compositions comprise 0–8 wt % of caprolactone acrylate. In another embodiment, the present compositions comprise 0–3 wt % of caprolactone acrylate. In an even further embodiment, however, the present compositions are absent caprolactone acrylate.

It is, of course, possible to use mixtures or combinations of compatible free radical polymerizable components.

additional free radical polymerizable component. These can be, for example, tri, tetra, penta, or hexafunctional monomeric or oligomeric aliphatic (meth)acrylates.

Suitable as aliphatic polyfunctional (meth)acrylates are, for example, the triacrylates and trimethacrylates of hexane-2,4,6-triol, glycerol, or 1,1,1-trimethylolpropane, or 1,1,1-trimethylolpropane and hydroxy group-containing tri(meth) acrylates which are obtained by, for instance, the reaction of triepoxy compounds with (meth)acrylic acid. It is also possible to use, for example, pentaerythritol polyacrylates such as, for instance, dipentaerythritolhexa(meth)acrylate.

It is also possible to use hexafunctional urethane (meth) acrylates. Those urethane (meth)acrylates are known to the person skilled in the art and can be prepared in known manner, for example by reacting a hydroxy-terminated polyurethane with acrylic acid or methacrylic acid, or by reacting an isocyanate-terminated prepolymer with hydroxyalkyl (meth)acrylates to form the urethane (meth)acrylate.

If present, the compositions preferably comprise, relative to the total weight of the composition, at least 5 wt % of one or more additional free radical polymerizable compounds, more preferably at least 10 wt %, and most preferably at least 15 wt %. The compositions preferably comprise, relative to the total weight of the composition, less than 70 wt % of one or more additional free radical polymerizable compounds, more preferably less than 50 wt %, and most preferably less than 30 wt %.

D. Hydroxy-functional Compounds that are not Free Radical Polymerizable

The present compositions may comprise suitable non-free radical polymerizable hydroxy-functional compounds.

The hydroxyl-containing material which can be used in the present invention may be any suitable organic material having a hydroxyl functionality of at least 1, and preferably at least 2. The material is preferably substantially free of any groups which interfere with the curing reactions or which are thermally or photolytically unstable.

Any hydroxy group may be employed for the particular purpose. Preferably the hydroxyl-containing material contains two or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000.

Representative examples of hydroxyl-containing materials having a hydroxyl functionality of 1 include alkanols, monoalkyl ethers of polyoxyalkyleneglycols, monoalkyl ethers of alkyleneglycols, and others, and combinations thereof.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(−)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; poly(oxyethylene-oxybutylene) random or block copolymers; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

Preferred hydroxyl-containing monomers include 1,4-cyclohexanedimethanol and aliphatic and cycloaliphatic monohydroxy alkanols. Preferred hydroxyl-containing oligomers and polymers include hydroxyl and hydroxyl/epoxy functionalized polybutadiene, polycaprolactone diols and triols, ethylene/butylene polyols, and monohydroxyl functional monomers. Preferred examples of polyether polyols are polypropylene glycols of various molecular weights and glycerol propoxylate-B-ethoxylate triol. Especially preferred are linear and branched polytetrahydrofuran polyether polyols available in various molecular weights, such as in the range of 150–4000 g/mol, preferably in the range of 150–1500 g/mol, more preferably in the range of 150–750 g/mol.

If present, the composition preferably comprises, relative to the total weight of the composition, at least 1 wt % of one or more non-free radical polymerizable hydroxy-functional compounds, more preferably at least 5 wt %, and most preferably at least 10 wt %. Furthermore, the composition preferably comprises, relative to the total weight of the composition, at most 60 wt % of one or more non-free radical polymerizable hydroxy-functional compounds, more preferably at most 40 wt %, and most preferably at most 25 wt %.

E. Cationic Photoinitiator

In the compositions according to the invention, any suitable type of photoinitiator that, upon exposure to actinic radiation, forms cations that initiate the reactions of the cationically polymerizable compounds, such as epoxy material(s), can be used. There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which applications are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring), and both books are hereby incorporated in their entirety by reference.

Preferred initiators include diaryl iodonium salts, triaryl sulfonium salts, or the like. Typical photo-polymerization initiators are represented by the following formulae (8) and (9):

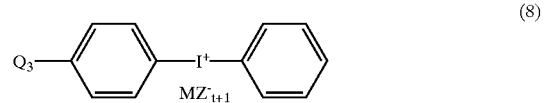

(8)

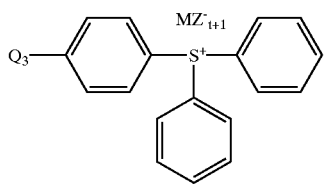

(9)

wherein

Q₃ represents a hydrogen atom, an alkyl group having 1 to 18 carbon atoms, or an alkoxyl group having 1 to 18 carbon atoms;

M represents a metal atom, preferably antimony;

Z represents a halogen atom, preferably fluorine; and t is the valent number of the metal, for example 6 in the case of antimony.

Preferred cationic photoinitiators include iodonium photoinitiators, e.g. iodonium tetrakis (pentafluorophenyl) borate, because they tend to be less yellowing, especially when used in combination with photosensitizers such as, for instance, n-ethyl carbazole.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904. Other preferred sensitizers are benzoperylene, 1,8-diphenyl-1,3,5, 7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation.

Preferably, the present composition comprises, relative to the total weight of the composition, 0.1–15 wt % of one or more cationic photoinitiators, more preferably 1–10 wt %.

F. Free Radical Photoinitiator

The compositions may employ a photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 349 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy) phenyl}-2-methyl-1-propanone, or 2-hydroxyisopropyl phenyl ketone (also called 2-hydroxy-2,2-dimethyl-acetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772, 530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula (10)

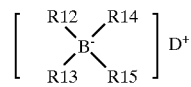

(10)

wherein D⁺ is a cationic dye and $R_{12}$, $R_{13}$, $R_{14}$, and $R_{15}$ are each independently of the others alkyl, aryl, alkaryl, allyl, aralkyl, alkenyl, alkynyl, an alicyclic or saturated or unsaturated heterocyclic group. Preferred definitions for the radicals $R_{12}$ to $R_{15}$ can be found, for example, in published European patent application EP 223587.

Preferred free radical photoinitiators include 1-hydroxycyclohexyl phenyl ketone, 2-hydroxy-2-methyl-1-phenylpropan-1-one, 2,2-dimethoxyacetophenone, and 2,4,6-trimethylbenzoyldiphenylphosphine oxide. These photoinitiators tend to be comparatively less yellowing.

Preferably, the present composition comprises, relative to the total weight of the composition, 0.1–15 wt % of one or more free radical photoinitiators, more preferably 1–10 wt %.

G. Additives

Additives may also be present in the composition of the invention. Stabilizers are often added to the compositions in order to prevent a viscosity build-up, for instance a viscosity build-up during usage in a solid imaging process. Preferred stabilizers include those described in U.S. Pat. No. 5,665, 792, the entire disclosure of which is hereby incorporated by reference. Such stabilizers are usually hydrocarbon carboxylic acid salts of group IA and IIA metals. Most preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers are polyvinylpyrrolidones and polyacrylonitriles. Other possible additives include dyes, pigments, fillers (e.g. silica particles—preferably cylindrical or spherical silica particles—, glass beads, or talc), antioxidants, wetting agents, photosensitizers for the free-radical photoinitiator, leveling agents, surfactants and the like.

Properties

The present compositions, after cure, provide products with improved clarity: The ratio of the clarity of the present composition, after cure, to the clarity of a comparable composition, after cure, is preferably greater than 1.03, said comparable composition being identical to said radiation-curable composition except that said comparable composition does not comprise a compatible free radical polymerizable component. Preferably the clarity ratio is at least 1.05, more preferably at least 1.07, even more preferably at least 1.09, and most preferably the clarity ratio of the present composition is at least than 1.2.

Preferably, the clarity of the present compositions after cure, as measured according to the method set forth in the Example section below, is at least 90%, more preferably at least 95%.

Applications

The present compositions are suitable for a wide variety of applications. For instance, the compositions can be used to prepare a three dimensional object by rapid prototyping. Rapid prototyping, sometimes also referred to as "solid imaging" or "stereolithography", is a process wherein a photoformable liquid is coated into a thin layer upon a surface and exposed imagewise to actinic radiation such that the liquid solidifies imagewise. This coating is most conveniently done if the composition is a liquid at room temperature, but a solid composition may also be melted to form a layer. Subsequently, new thin layers of photoformable liquids are coated onto previous layers of liquid or previously solidified sections. Then the new layer is exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding liquid composition.

Accordingly, a rapid prototyping process can for instance be described as:

(1) coating a thin layer of a composition onto a surface;

(2) exposing said thin layer imagewise to actinic radiation to form an imaged cross-section, wherein the radiation is of sufficient intensity to cause substantial curing of the thin layer in the exposed areas;

(3) coating a thin layer of the composition onto the previously exposed imaged cross-section;

(4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;

(5) repeating steps (3) and (4) a sufficient number of times in order to build up the three-dimensional article.

EXAMPLES

The following examples are given as particular embodiments of the invention and to demonstrate the practice and advantages thereof. It is to be understood that the examples are given by way of illustration and are not intended to limit the specification or the claims that follow in any manner.

A "Base Composition" was prepared by mixing the ingredients in the amounts listed in Table 1:

TABLE 1

| Base Composition I: | |
| --- | --- |
| Ingredient | Weight % |
| 3,4-Epoxy Cyclohexyl Methyl-3,4-Epoxy Cyclohexyl Carboxylate | 59.4 |
| α-hydro-ω-hydroxy-poly(oxy-1,4-butanediyl); Mn~250 | 18 |
| Irganox 1035 | 0.2 |
| Dipentaerythritol hexacrylate | 17 |
| 1-hydroxycyclohexyl phenyl ketone | 2.3 |
| triarysulfonium hexafluoroantimonate salts | 3.1 |

15 grams of this Base Composition I was weighed into the lid section of a Coming 60 mm/Tissue Culture polystyrene petridish ("Sterile 25010"). The thickness of the flat surface of the lid section was 0.86 mm, and the thickness of the sample layer and the lid's flat surface combined was 5.4 mm. The lid section was subsequently placed in a UV curing apparatus (Post-Curing-Apparatus "PCA" from 3-D Systems, California). The PCA had 10 Philips TLK 40W/05 bulbs that had been used for between 300 and 400 hours. The composition was first cured for 5 minutes from the top (which substantially hardened the composition), then for 5 minutes with the dish inverted, and finally 10 more minutes with the dish on end.

Next, an empty lid section of a second "Sterile 25010" petridish was placed in a Shimadzu UV-2401 PC spectrophotometer such that the bottom of the lid part was normal to the sample beam of the spectrophotometer. No object was placed in front of the reference beam (i.e. air was used as the reference), and a spectrum of the empty lid section was obtained in the range 400–800 nm. The area under the curve was calculated by integration and considered for the purpose of this evaluation as being representative of a clarity of 100%.

Then the empty lid section was replaced with the lid section containing the cured base composition I and again a spectrum was obtained in the 400–800 nm range (again, air was used as the reference). The area under the thus obtained spectrumcurve was integrated and divided by the area under the curve obtained with the empty petridish. The calculated value was 0.872, and for the purpose of this evaluation the base composition was therefore considered to have a clarity of 87.2%.

Subsequently, various other compositions were prepared by adding components to the base composition I. Then the same procedure as for base composition I was followed to calculate the clarity of these compositions (i.e. putting 15 grams of the composition into a lid section of a "Sterile 2501 0" petridish, placing the lid section into the PCA from 3-D Systems, etc.) The formulation of these other compositions and their calculated clarity are set forth in Tables 2–10.

TABLE 2

Alkoxylated NPGDA vs. Non-Alkoxylated NPGDA, 5 wt %

| Ingredients | Comp. Ex. A | Comp. Ex. B | Example 1 | Example 2 |
|---|---|---|---|---|
| Base Comp. I (wt %) | 100 | 95 | 95 | 95 |
| Neopentylglycol diacrylate (wt %) | 0 | 5 | 0 | 0 |
| Ethoxylated neopentylglycol diacrylate (1 EO/Acrylate) (wt %) | 0 | 0 | 5 | 0 |
| Propoxylated neopentylglycol diacrylate (1 PO/Acrylate) (wt %) | 0 | 0 | 0 | 5 |
| Properties | | | | |
| Clarity (%) | 85.9 | 87.4[a,b] | 89.2 | 91.5 |
| Clarity divided by clarity of base composition | 1 | 1.017[a] | 1.038 | 1.065 |

Table Notes:
[a]Average of two measurements.
[b]Indicates a value that has been normalized to the base clarity value of Comp. Ex. A; the value is normalized by determining the ratio of the actual absolute clarity value to the actual base composition clarity value, and then normalizing the actual absolute clarity value by multiplying the thus obtained ratio with the base clarity value of Comp. Ex. A.

TABLE 3

Alkoxylated NPGDA vs. Non-Alkoxylated NPGDA, 10 wt %

| Ingredients | Comp. Ex. A | Comp. Ex. C | Example 3 | Example 4 |
|---|---|---|---|---|
| Base Comp. I (wt %) | 100 | 90 | 90 | 90 |
| Neopentylglycol diacrylate (wt %) | 0 | 10 | 0 | 0 |
| Ethoxylated neopentylglycol diacrylate (1 EO/Acrylate) (wt %) | 0 | 0 | 10 | 0 |
| Propoxylated neopentylglycol diacrylate (1 PO/Acrylate) (wt %) | 0 | 0 | 0 | 10 |
| Properties | | | | |
| Clarity (%) | 85.9 | 88.5[a,b] | 92.1 | 93.3 |
| Clarity divided by clarity of base composition | 1 | 1.030[a] | 1.072 | 1.086 |

TABLE 4

Alkoxylated v. Non-alkoxylated Hexane Diol Diacrylate, 10 wt %

| Ingredients | Comp. Ex. A | Comp. Ex. D | Ex. 5 | Ex. 6 |
|---|---|---|---|---|
| Base Comp. I | 100 | 90 | 90 | 90 |
| Hexane diol diacrylate | 0 | 10 | 0 | 0 |
| Ethoxylated hexane diol diacrylate (1 EO/Acrylate) | 0 | 0 | 10 | 0 |
| Propoxylated hexane diol diacrylate (1 PO/Acrylate) | 0 | 0 | 0 | 10 |
| Properties | | | | |
| Clarity | 85.9 | 86.8[a,b] | 92.0 | 91.8 |
| Clarity divided by clarity of base composition | 1 | 1.010[a] | 1.071 | 1.069 |

TABLE 5

Concentration of Alkoxylated Compound in Composition

| Ingredients | Comp. Ex. A | Comp. Ex. E | Comp. Ex. F | Ex. 7 | Ex. 2 | Ex. 4 |
|---|---|---|---|---|---|---|
| Base Comp. I | 100 | 99 | 98 | 97 | 95 | 90 |
| Propoxylated neopentylglycol diacrylate (1 PO/Acrylate) | 0 | 1 | 2 | 3 | 5 | 10 |
| Properties | | | | | | |
| Clarity | 85.9 | 82.2 | 87.1 | 88.7 | 91.5 | 93.3 |
| Clarity divided by clarity of base composition | 1 | 0.957 | 1.014 | 1.033 | 1.065 | 1.086 |

TABLE 6

Degree of Alkoxylation for Aromatic Components

| Ingredients | Comp. Ex. A | Comp. Ex. G | Comp. Ex. H | Example 8 | Example 9 |
|---|---|---|---|---|---|
| Base Comp. I | 100 | 90 | 90 | 90 | 90 |
| Ethoxylated Bisphenol A Diacrylate: | | | | | |
| 1 EO/Acrylate | 0 | 10 | 0 | 0 | 0 |
| 2 EO/Acrylate | 0 | 0 | 10 | 0 | 0 |
| 4 EO/Acrylate | 0 | 0 | 0 | 10 | 0 |
| 15 EO/Acrylate | 0 | 0 | 0 | 0 | 10 |
| Properties | | | | | |
| Clarity | 85.9 | 76.4 | 83.6 | 89.5 | 92.7 |
| Clarity divided by clarity of base composition | 1 | 0.889 | 0.973 | 1.042 | 1.079 |

TABLE 7

Alkoxylated Bisphenol A Diacrylate vs. Alkoxylated Bisphenol A Dimethacrylate

| Ingredients | Comp. Ex. A | Comp. Ex. H | Comp. Ex. I |
|---|---|---|---|
| Base Comp. I | 100 | 90 | 90 |
| Ethoxylated Bisphenol A Diacrylate (2 EO/Acrylate) | 0 | 10 | 0 |
| Ethoxylated Bisphenol A Dimethacrylate (2 EO/Methacrylate) | 0 | 0 | 10 |
| Properties | | | |
| Clarity | 85.9 | 83.6 | 58.5 |
| Clarity divided by clarity of base composition | 1 | 0.973 | 0.681 |

TABLE 8

| Ingredients | Comp. Ex. A | Ex. 10 | Ex. 11 | Ex. 12 | Ex. 13 | Ex. 14 |
|---|---|---|---|---|---|---|
| Base Comp. I | 100 | 90 | 90 | 90 | 95 | 90 |
| Tripropylene glycol diacrylate | 0 | 10 | 0 | 0 | 0 | 0 |
| Polypropyleneglycol dimethacrylate (Mw~375) | 0 | 0 | 10 | 0 | 0 | 0 |
| Polytetrahydrofuran diacrylate (Mw~1000 g/mol) | 0 | 0 | 0 | 10 | 5 | 0 |
| Caprolactone acrylate | 0 | 0 | 0 | 0 | 0 | 10 |
| Properties | | | | | | |
| Clarity | 85.9 | 96.0 | 96.0 | 95.9 | 93.6 | 93.5 |
| Clarity divided by clarity of base composition | 1 | 1.118 | 1.118 | 1.116 | 1.090 | 1.088 |

TABLE 9

Miscellaneous Experiments

| Ingredients | C. Ex. A | C. Ex. J | C. Ex. K | C. Ex. L | C. Ex. M | C. Ex. N | C. Ex. O | C. Ex. P |
|---|---|---|---|---|---|---|---|---|
| Base Comp. I | 100 | 90 | 90 | 95 | 0 | 0 | 0 | 0 |
| Bisphenol A glycerolate diacrylate (1 glycerol/Acr) | 0 | 10 | 0 | 0 | 0 | 0 | 0 | 0 |
| Bisphenol A glycerolate dimethacrylate (1 glycerol/M-Acr) | 0 | 0 | 10 | 0 | 0 | 0 | 0 | 0 |
| Ethoxylated Bisphenol A diacrylate (1.5 EO/Acr) | 0 | 0 | 0 | 5 | 0 | 0 | 0 | 0 |
| 4-hydroxybutane acrylate | 0 | 0 | 0 | 0 | 10 | 0 | 0 | 0 |
| hexanediol diacrylate | 0 | 0 | 0 | 0 | 0 | 5 | 0 | 0 |
| butanediol diacrylate | 0 | 0 | 0 | 0 | 0 | 0 | 5 | 10 |
| Properties | | | | | | | | |
| Clarity | 85.9 | 83.2 | 76.3 | 80.4 | 87.8 | 86.0 | 83.0[b] | 87.9[a,b] |
| Clarity divided by clarity of base composition | 1 | 0.967 | 0.876 | 0.924 | 1.022 | 1.001 | 0.966 | 1.023[a] |

TABLE 10

Miscellaneous Experiments

| Ingredients | C. Ex. A | Ex. 15 | Ex. 16 | Ex. 17 | Ex. 18 | Ex. 19 | C. Ex. Q |
|---|---|---|---|---|---|---|---|
| Base Comp. I | 100 | 95 | 95 | 90 | 90 | 95 | 90 |
| Ethoxylated trimethylolpropane triacrylate (1 EO/Acr.) | 0 | 5 | 0 | 0 | 0 | 0 | 0 |
| Propoxylated trimethylolpropane triacrylate (1 PO/Acr.) | 0 | 0 | 5 | 10 | 0 | 0 | 0 |
| Tetraethyleneglycoldiacrylate | 0 | 0 | 0 | 0 | 10 | 0 | 0 |
| Neopentylglycol methyl ether acrylate (2 PO/OH) | 0 | 0 | 0 | 0 | 0 | 5 | 10 |

TABLE 10-continued

Miscellaneous Experiments

| Ingredients | C. Ex. A | Ex. 15 | Ex. 16 | Ex. 17 | Ex. 18 | Ex. 19 | C. Ex. Q |
|---|---|---|---|---|---|---|---|
| Properties | | | | | | | |
| Clarity | 85.9 | 87.9 | 91.8[b] | 92.0[b] | 88.9 | 89.0 | 87.8 |
| Clarity divided by clarity of base composition | 1 | 1.023 | 1.069 | 1.071 | 1.035 | 1.036 | 1.022 |

In addition, a second base composition was prepared. The ingredients and the amounts in which they were mixed are listed in Table 11.

TABLE 11

Base Composition II

| Ingredient | Weight % |
|---|---|
| 3,4-Epoxy Cyclohexyl Methyl-3,4-Epoxy Cyclohexyl Carboxylate | 46 |
| Polytetrahydrofuran diglycidyl ether | 26 |
| Acrylate ester of bisphenol A based epoxy | 21.5 |
| antioxidant (Irganox 1035, Ciba Geigy) | 0.2 |
| free radical photoinitiator (Irgacure 184, Ciba Geigy) | 3.2 |
| cationic photoinitiator (Cyracure UVI-6974, Union Carbide) | 2.7 |
| Sodium carbonate | <0.5 |

In order to determine the clarity of base composition II, and of compositions prepared with base composition II, the same procedure was followed as with base composition I. The samples prepared are detailed in Table 12:

TABLE 12

Results for Base Comp II.

| Ingredients | Comp. Ex. R | Ex. 20 | Ex. 21 |
|---|---|---|---|
| Base Comp. II (wt %) | 100 | 90 | 90 |
| Propoxylated neopentylglycol diacrylate (1 PO/Acrylate) (wt %) | 0 | 10 | 0 |
| Polytetrahydrofuran diacrylate (Mw~1000 g/mol) (wt %) | 0 | 0 | 10 |
| Properties | | | |
| Clarity (%) | 27.2 | 35.0 | 67.6 |
| Clarity divided by clarity of base composition | 1 | 1.29 | 2.49 |

Having described specific embodiments of the present invention, it will be understood that many modifications thereof will readily be apparent to those skilled in the art, and it is intended therefore that this invention is limited only by the spirit and scope of the following claims.

What is claimed is:

1. A radiation-curable composition comprising:
   (i) a cationically polymerizable component;
   (ii) a cationic photoinitiator;
   (iii) a free radical polymerizable component selected from the group consisting of
      (a) non-aromatic free radical polymerizable components comprising at least one $C_2$–$C_4$ other group; and
      (b) aromatic free radical polymerizable components comprising more than four $C_2$–$C_4$ ether groups;
   (iv) a free radical photoinitiator; and
   (v) a hydroxy-functional component selected from the group consisting of polyether polyols;
   wherein the composition, after cure, has a clarity of more than 90%.

2. The composition of claim 1, wherein said free radical polymerizable component is selected from the group consisting of:
   (a) non-aromatic free radical polymerizable components comprising at least two $C_2$–$C_4$ ether groups; and
   (b) aromatic free radical polymerizable components comprising more than four $C_2$–$C_4$ ether groups.

3. The composition of claim 1, wherein said free radical polymerizable component is selected from the group consisting of alkoxylated bisphenol A diacrylate, tripropyleneglycol diacrylate, polypropyleneglycol dimethacrylate, alkoxylated neopentylglycol diacrylate, alkoxylated hexanediol diacrylate, polytetrahydrofuran diacrylate, and alkoxylated trimethylolpropane triacrylate.

4. The composition of claim 1, wherein said free radical polymerizable component is a diacrylate component.

5. The composition of claim 4, further comprising a free radical polymerizable component having at least three radiation-curable groups.

6. The composition of claim 1, wherein said composition is absent caprolactone acrylate.

7. A process for producing a three-dimensional object comprising:
   (1) coating a thin layer of the composition of claim 1 onto a surface;
   (2) exposing said thin layer imagewise to actinic radiation to form an imaged cross-section, wherein the radiation is of sufficient intensity to cause substantial curing of the thin layer in the exposed areas;
   (3) coating a thin layer of the composition of claim 1 onto the previously exposed imaged cross-section;
   (4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;
   (5) repeating steps (3) and (4) a sufficient number of times in order to build up the three-dimensional article.

8. A three dimensional object obtained by the process of claim 7.

9. The radiation-curable composition of claim 1, wherein said radiation-curable composition comprises, relative to the total weight of the composition, at most 15 wt % of said free radical polymerizable component.

10. The radiation-curable composition of claim 1, wherein said radiation-curable composition comprises, relative to the total weight of the composition, 3–10 wt % of said free radical polymerizable component.

11. The radiation-curable composition of claim 1, wherein said cationically polymerizable component is an epoxy resin.

12. The radiation-curable composition of claim 1, wherein said cationically polymarizable component includes a cyclohexene oxide component.

13. The radiation-curable composition of claim 1, wherein said cationic photoinitiator comprises anitimonate.

14. The radiation-curable composition of claim 1, wherein said composition further comprises a free radical polymerizable component having at least 5 free radical polymerizable groups.

15. The composition of claim 1, wherein said hydroxy-functional component is selected from the group consisting of polyoxypropylene glycols and polyoxypropylene triols of molecular weights from about 200 to about 10,000.

* * * * *